United States Patent [19]

Michalski et al.

[11] Patent Number: 4,816,752
[45] Date of Patent: Mar. 28, 1989

[54] METHOD AND APPARATUS FOR LOW POWER OFFSET CORRECTION OF AMPLIFIED SENSOR SIGNALS

[75] Inventors: Steven E. Michalski, Franklin, Wis.; Kevin M. Andrews, Rockford, Ill.; Daniel Mieczkowski, Kenosha, Wis.

[73] Assignee: Snap-on Tools Corporation, Kenosha, Wis.

[21] Appl. No.: 179,203

[22] Filed: Apr. 7, 1988

[51] Int. Cl.[4] .................... G01R 1/02; G11C 27/02
[52] U.S. Cl. .................... 324/130; 307/353; 328/151; 330/9
[58] Field of Search .................. 324/130; 330/9; 328/151; 307/352, 353; 374/172; 73/765; 341/118

[56] References Cited

U.S. PATENT DOCUMENTS

| | | | |
|---|---|---|---|
| 3,105,230 | 9/1963 | MacIntyre | 324/130 |
| 3,667,041 | 5/1972 | Senour | 324/130 |
| 3,988,689 | 10/1976 | Ochi et al. | 330/9 |
| 4,119,960 | 10/1978 | Hill | 328/151 |
| 4,282,515 | 8/1981 | Patterson, III | 328/151 |
| 4,319,359 | 3/1982 | Wolf | 328/111 |
| 4,363,976 | 12/1982 | Minor | 307/353 |
| 4,429,282 | 1/1984 | Saari | 330/9 |
| 4,441,068 | 4/1984 | Smith | 323/351 |
| 4,464,061 | 8/1984 | Kamiya | 368/202 |
| 4,495,463 | 1/1985 | Milkovic | 324/142 |
| 4,523,566 | 6/1985 | Kobayashi | 123/425 |
| 4,535,287 | 8/1985 | Milkovic | 324/142 |
| 4,542,354 | 9/1985 | Robinton et al. | 330/9 |
| 4,560,975 | 12/1985 | Jarva | 341/118 |
| 4,577,154 | 3/1986 | Takagi et al. | 328/158 |
| 4,636,092 | 1/1987 | Hegyi | 374/172 |
| 4,641,324 | 2/1987 | Karsh et al. | 328/151 |
| 4,647,905 | 3/1987 | Hantke et al. | 377/42 |
| 4,682,102 | 7/1987 | Milkovic | 324/142 |
| 4,694,341 | 9/1987 | Soneda et al. | 328/151 |
| 4,700,143 | 10/1987 | Anthony et al. | 328/151 |

Primary Examiner—Ernest F. Karlsen
Attorney, Agent, or Firm—Emrich & Dithmar

[57] ABSTRACT

A sensor is periodically energized and the sensor output is amplified, the amplified signal being applied to two sample-and-hold circuits which are alternately activated in response to the sensor drive, one being activated only when the sensor is energized and the other being activated when the sensor is not energized. One of the samples is subtracted from the other in a summer for cancelling the amplifier offset. The summer output may be buffered, and there is also applied to the summer an offset correction signal for cancelling sensor offset and buffer offset inaccuracies.

19 Claims, 2 Drawing Sheets

METHOD AND APPARATUS FOR LOW POWER OFFSET CORRECTION OF AMPLIFIED SENSOR SIGNALS

BACKGROUND OF THE INVENTION

1. Field of the Invention

The invention relates to sensor circuitry and, in particular to circuitry for driving a sensor transducer and processing the sensor output to produce a usable output signal.

2. Description of the Prior Art

The sensor output may have inaccuracies therein as a result of thermal sensitivity of the sensor or because of residual signals which may occur in a sensor, such as hysteresis, residual magnetism, etc., depending upon the type of sensor.

Also, many sensor devices produce very low level output signals. In order that these signals can be utilized to drive associated devices, such as indicators and the like, the signal must first be amplified. The amplifier circuitry may introduce errors which are commonly referred to as "offset". One type of amplifier offset is that introduced by thermal drift. The amplifier circuitry is temperature-sensitive, so that the output may vary with temperature, independently of the input signal. Another type of amplifier offset which occurs in operational amplifiers is any voltage other than zero which appears at the output of the device when the input terminals are connected together, i.e., when there is no input signal. Such an offset may result, for example from a mismatch of the active elements of the device or of the load impedances.

It is known to correct such offsets by various error correction techniques. Such techniques include offset nulling or zeroing techniques wherein a correction signal is algebraically added to the amplified output signal to cancel the offset error therein. Sample and hold circuits have been utilized in such offset nulling arrangements. Such circuits typically attempt to derive from the output signal a signal which is proportional to the offset component thereof and then algebraically sum that derived signal with the output signal to produce a corrected output. But these prior arrangements have been used with a continuous analog output signal from the sensor. Thus, complex circuitry has been utilized to produce a correction signal which is proportional only to the offset.

Furthermore, many of these prior devices are relatively high-power arrangements, wherein the sensor circuitry typically draws a current of 25-30 ma. Such circuitry is not suitable for battery-operated applications, either the battery life is too short, thus requiring either frequent battery replacement or the use of expensive and inconvenient rechargeable batteries.

In applications other than sensor circuitry, it has been known to reduce the power consumption of battery-operated devices by providing an intermittent operation, wherein the circuitry draws power only during very short periodically occurring intervals. If the duty cycle, i.e., the ratio of the duration of the ON interval to the duration of the time between the beginning of successive ON intervals, is very small, substantial power savings can be realized.

SUMMARY OF THE INVENTION

It is a general object of the present invention to provide an improved sensor circuit which avoids the disadvantages of prior arrangements while affording additional structural and operating advantages.

An important feature of the invention is the provision of a sensor circuit which provides offset error correction, while at the same time being characterized by low power consumption.

In connection with the foregoing feature, it is another feature of the invention to provide a sensor circuit of the type set forth which is suitable for battery-powered operation.

Still another feature of the invention is the provision of a sensor circuit of the type set forth, wherein the power saving and error correcting aspects are commonly controlled.

These and other features of the invention are attained by providing low power, error-corrected signal apparatus for a sensor comprising: drive means adapted to be coupled to the sensor for intermittently energizing the sensor to enable it to produce a sensor signal in response to a stimulus, signal processing means having an input adapted to be coupled to the sensor for receiving the sensor signal and having an output, the signal processing means producing a processed signal including a processing offset error, storage means coupled to the output of the signal processing means for storing first and second samples of the processed signal taken respectively during an interval when the sensor is energized and during an interval when the sensor is not energized, and means coupled to the storage means for subtracting the second sample from the first sample to produce an output signal from which the processing offset error has been cancelled.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
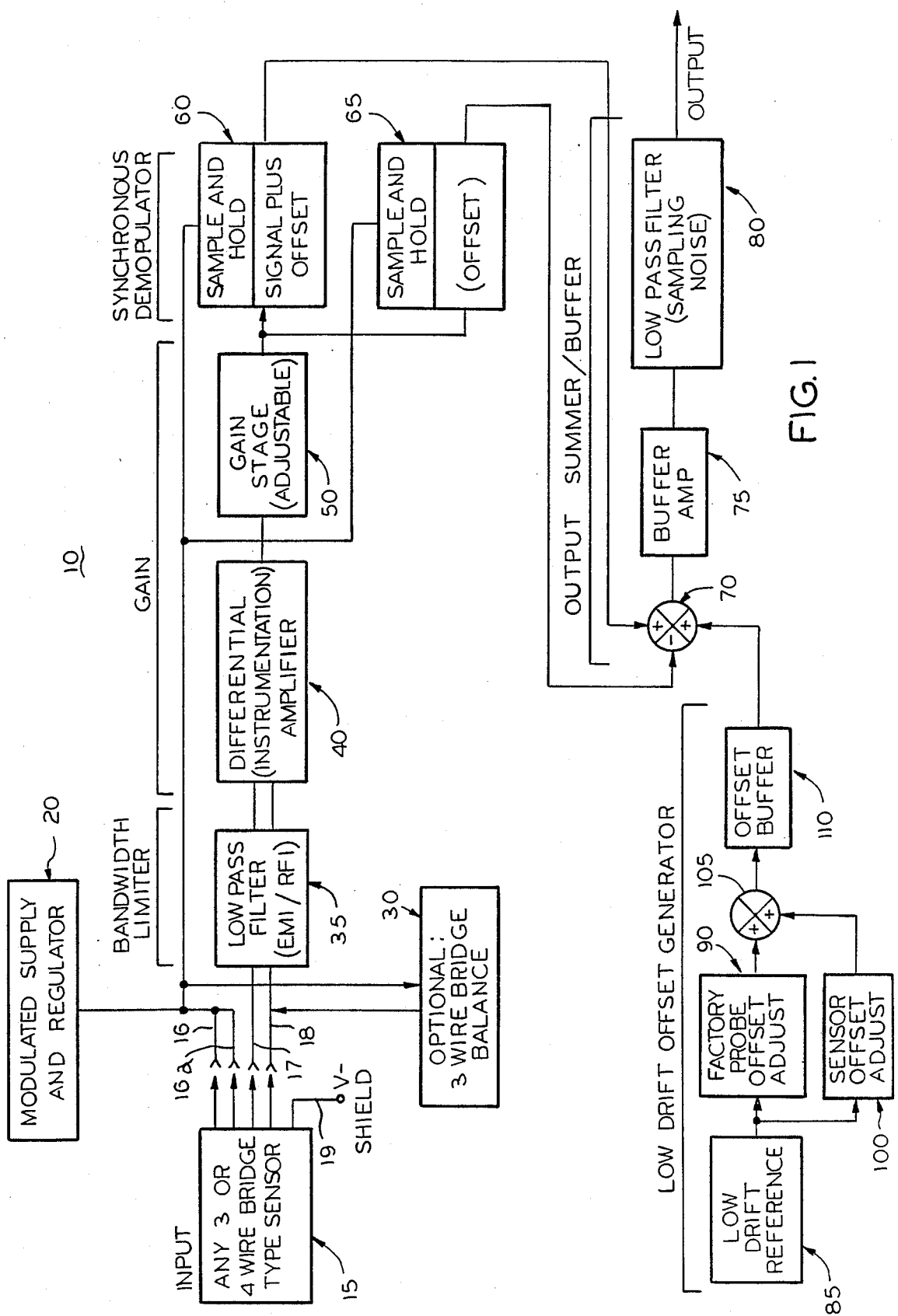
FIG. 1 is a functional block diagram of the sensor circuitry of the present invention.

In FIG. 1 there is illustrated a block diagram of a signal processing circuit, generally designated by the numeral 10, constructed in accordance with and embodying the features of the present invention. The signal processing circuit 10 is adapted to be coupled to an associated sensor 15, which may be a three- or four-wire bridge-type sensor. The processing circuit 10 is particularly useful with sensors of the type which normally draw relatively high currents, such as pressure testers, clamp-on ammeters, strain gauges, and the like. The processing circuit 10 has four terminals including drive terminals 16 and 16a, respectively adapted to be coupled to the input terminals of the associated sensor 15, and input terminals 17 and 18, which are respectively adapted to be coupled to the output terminals of the associated sensor 15. Both the sensor 15 and the signal processing circuit 10 may also be provided with a shield terminal 19 adapted to be coupled to an associated electromagnetic shield (not shown). In operation, the processing circuit 10 provides drive signals to the sensor 15, energizing it to permit it to respond to the particular type of stimulus which it is designed to sense and produce output signals. The processing circuit 10 also receives the output signals from the sensor 15 and processes them to render them capable of driving associated circuitry, such as an analog-to-digital converter, indicator circuitry or the like.

The processing circuit 10 includes a drive circuit which includes a modulated supply and regulator circuit 20, the output of which is applied to the sensor 15 through the terminals 16 and 16a.

The modulated supply and regulator circuit 20 provides a pulse output signal having a very small duty cycle, preferably approximately 2.5%. This output signal is applied to the input terminals of the sensor 15 for energizing it intermittently. More specifically, the sensor 15 is energized during the duration of each of the drive pulses, and is not energized during the interval between pulses. When the sensor 15 is not energized, it is not capable of producing an output signal. If the sensor 15 is of the four-wire type, it can be connected directly to the processing circuit 10 with no modification. However, in the event of three-wire type sensors, the processing circuit may optionally be provided with a bridge balance network 30 which is coupled across the input and output terminals of the sensor 15. The output signals from the sensor 15 are applied through the terminals 17 and 18 to a low pass filter circuit 35, which eliminates electromagnetic and radio frequency interference signals, the filtered signal then being applied to an instrumentation amplifier 40, which preferably includes a differential amplifier.

The output of the instrumentation amplifier 40 is then applied through a gain amplifier stage 50 to each of two sample-and-hold circuits 60 and 65, each of which is also connected to the output of the modulated supply and regulator circuit 20. The pulse signal output from the modulated supply and regulator circuit 20 is also coupled to the sample-and-hold circuits 60 and 65 so that they are alternately enabled. Thus, the sample-and-hold circuit 60 is enabled during the duration of each of the drive pulses, i.e., during the time when the sensor 15 is energized, while the sample-and-hold circuit 65 is enabled during the interval between pulses, when the sensor 15 is not energized.

The amplifiers 40 and 50 introduce offset errors which may be of the differential amplifier offset type, and/or the thermal drift type. Since these offset errors are present whenever power is supplied to the processing circuit 10, an offset component always appears in the output of the gain stage 50. The other component of the output of the gain stage 50 is the amplified input signal to the processing circuit 10 from the sensor 15. But that input signal is present only when the sensor 15 is energized. In other words, the input sensor signal component will be present when the sample-and-hold circuit 60 is enabled, but not when the sample-and-hold circuit 65 is enabled. Accordingly, the sample-and-hold circuit 60 obtains and stores a signal sample which includes both the sensor input component and the amplifier offset component, whereas the sample-and-hold circuit 65 obtains and stores a signal sample which includes only the offset component.

The sample stored in the sample-and-hold circuit 65 is then subtracted from that stored in the sample-and-hold circuit 60 in an algebraic summer network 70 to produce a corrected signal, which is then further amplified in a buffer amplifier 75 and passed through a low pass filter 80 to remove sampling noise, resulting in a final output signal which is then applied to an associated device, such as an A/D converter.

In addition to the offset error introduced by the instrumentation amplifier 40 and the gain stage 50, further offset error may be present in the sensor 15 itself, and it may have residual signals such as hysteresis, residual magnetism and the like. Furthermore, the buffer amplifier 75 may introduce offset errors. In order to compensate for these additional offset errors, there is provided a low drift reference circuit 85 which provides a reference voltage which is then applied to each of two offset correction circuits, including a rough offset correction circuit 90 and a fine offset correction circuit 100. The rough offset correction circuit 90 provides a rough zeroing signal and the fine offset correction circuit 100 provides an auxiliary fine zeroing signal, the two zeroing signals being added in a summer circuit 105 and then applied through a buffer amplifier 110 to the summer 70. The circuits 90 and 100 are adjustable to permit the magnitude of the correction signal to be adjusted so that it just cancels the offset introduced the sensor 15 and the buffer amplifier 75.

It is a significant aspect of the present invention that, because the pulse output signal from the modulated supply and regulator circuit 20 has a very low duty cycle, the sensor 15 draws current for only a very small percentage at the time, thereby significantly reducing its power consumption. Since the processing circuit 10 itself only consumes approximately 3 ma, this permits the circuitry to conveniently be battery powered and, more particularly, to be powered by a single 9-volt battery. The fact that the sensor 15 is intermittently energized also permits the unique control of the sample-and-hold circuits 60 and 65 by the sensor drive pulse train, thereby providing a simple and efficient means for ensuring that the signal stored by the sample-and hold circuit 65 contains only the offset gain component.

Figure 2:
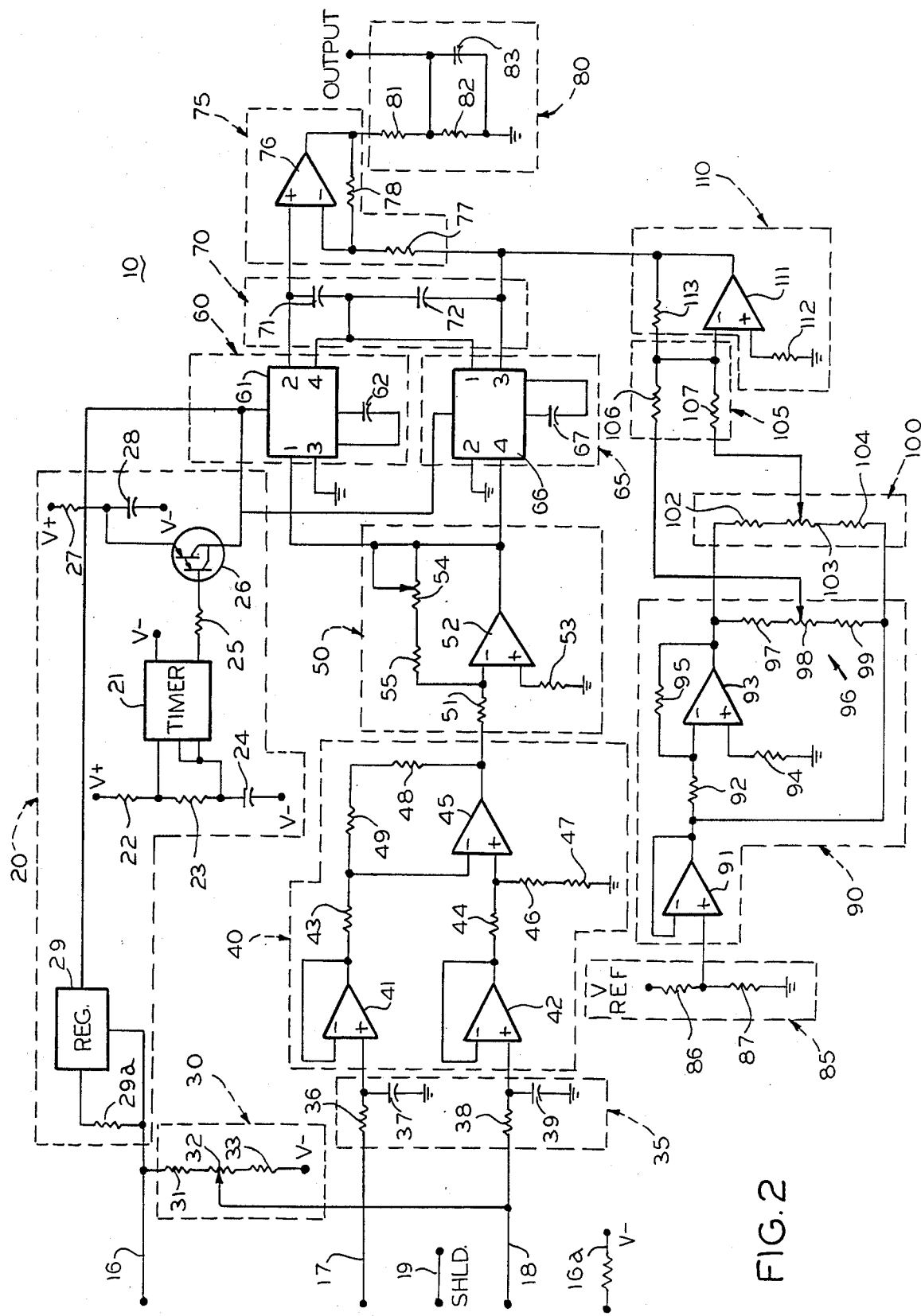
FIG. 2 is a schematic circuit diagram of the present invention.

Referring now to FIG. 2, the construction and operation of the processing circuit 10 will be described in greater detail. Power is provided by a 9-volt battery, the terminals of which are respectively at V+ and V−. Ground potential is established between the potentials of the positive and negative battery terminals so that, in a constructional embodiment, V+ is about 3 VDC above ground and V− is about 6 VDC below ground.

The modulated supply and regulator circuit 20 includes an integrated circuit timer 21 which may, for example, be an ICM 7555. Resistors 22 and 23 and a capacitor 24 are connected in series across the battery terminals, the resistors 22 and 23 a providing voltage divider and the junction therebetween being connected to the DC input terminal of the timer 21. The timer 21 has a trigger input which is connected to the junction between the resistor 23 and the capacitor 24, and a reset input which is connected to V−. The timer 21 produces a periodic pulse output, the circuit values being selected so that the duty cycle of the pulse strain is approximately 2.5%.

These pulses are applied from the output terminal of timer 21 through a resistor 25 to a base of a Darlington transistor 26, the emitter of which is connected to the junction between a resistor 27 and a capacitor 28 which are connected in series across the battery terminals. The collector of the Darlington transistor 26 is connected to the input of an integrated circuit voltage regulator 29, which may be a LM317. The output of the regulator 29 is connected through a resistor 29a to an adjustment terminal of the regulator 29 to provide for constant current regulation for the sensor, and to the terminal 16 for coupling to the input of the associated sensor 15. The collector of the Darlington transistor 26 is also connected to the sample-and-hold circuits 60 and 65.

In operation, the timer 21 functions as a free-running multivibrator which produces a square wave signal having a minimal ON (duty cycle) portion to reduce power consumption. The frequency of the drive signal is selected for the desired frequency response of the output (i.e., the higher the frequency, the faster the response). In a constructional embodiment of the invention, the drive signal is a 250 hz, 2.5% duty cycle pulse train, with 30 ma regulation. The Darlington transistor 26 provides a large current gain to the output signal of the timer 21, so that it can provide enough current to drive the regulator 29.

If the bridge balance network 30 is needed, it includes a voltage divider comprising a series connection of a resistor 31, a potentiometer 32 and a resistor 33 connected between terminal 16 and the V− supply, the wiper of the potentiometer 32 being connected to terminal 18.

The bandwidth of the output signal from the sensor 15 is limited by the low pass filter circuit 35 to ten times the the first harmonic frequency of the pulse train signal. This filtering rejects all electromagnetic interference and all radio frequency interference above this limit at −20 dB per decade. The cutoff frequency in a constructional embodiment of the invention is 50 Khz. The low pass filter circuit 35 includes a resistor 36 and a capacitor 37 connected between the terminal 17 and ground, and a resistor 38 and a capacitor 39 connected between the terminal 18 and ground.

The instrumentation amplifier circuit 40 includes operational amplifiers 41 and 42, the non-inverting input terminals of which are respectively connected to the terminals 17 and 18 through the low pass filter circuit 35. The outputs of the operational amplifiers 41 and 42 are respectively connected through resistors 43 and 44 to the inverting and non-inverting input terminals of an operational amplifier 45. The non-inverting input terminal of the operational amplifier 45 is also connected to ground through series-connected resistors 46 and 47, and the output of the operational amplifier 45 is coupled to its inverting input through feedback resistors 48 and 49.

The output of the operational amplifier 45 is coupled to the gain stage 50 and, particularly, is coupled through a resistor 51 to the inverting input terminal of an operational amplifier 52, the non-inverting input terminal of which is coupled to ground through a resistor 53. The output of the operational amplifier 52 is coupled to its inverting input through a feedback potentiometer 54 and a resistor 55, the wiper of the potentiometer 54 also being connected to the output of the operational amplifier 52 for providing gain adjustment. The instrumentation amplifier circuit 40 and the gain stage 50 provide the necessary gain for the particular sensor being used, and are designed to have sufficient frequency response to handle all the signals passed through the low pass filter circuit 35. Offset errors introduced in the instrumentation amplifier circuit 40 and the gain stage 50 are removed in the succeeding circuitry, as will be explained below.

The output of the gain stage 50 at the output of the operational amplifier 52 is coupled to the inputs of the sample-and-hold circuits 60 and 65. The sample-and-hold circuits 60 and 65, respectively include integrated circuit switched capacitor blocks 61 and 66, each of which may be an integrated circuit of the type sold by Linear Technology Corp. under the designation 1043CN, which is a low charge injection device, characterized by virtually negligible offset error. Each of the integrated circuits 61 and 66 has four input/output terminals 1, 2, 3 and 4, two of which are connected as inputs and two of which are connected as outputs. The circuits 61 and 66 also have externally connected capacitors 62 and 67, respectively. The integrated circuits 61 and 66 are oppositely connected, i.e., the circuit 61 has terminals 1 and 3 connected as the inputs and terminals 2 and 4 as the outputs, and the opposite is true of the circuit 66. Each of the integrated circuits 61 and 66 also has an oscillator input connected to the collector of the Darlington transistor 26 for receiving the timing pulse train from the modulated supply and regulator circulate 20. The outputs of the sample and hold circuits 60 and 65 are connected to the summer circuit 70, which includes series-connected capacitors 71 and 72. More specifically, the output terminals of the integrated circuit 61 are connected across the capacitor 71, while the output terminals of the integrated circuit 66 are connected across the capacitor 72.

In operation, when a pulse is received from the modulated supply and regulator circuit 20, the external capacitor (62 or 67) of the switched capacitor block circuit (60 or 65) is connected to terminals 1 and 3, while during the interval between pulses, that capacitor is connected to the terminals 2 and 4. When the capacitor is connected to the input terminals of the switched capacitor block circuit, it is charged to a voltage determined by the input voltage and then, when the switched capacitor block circuit is switched, the voltage on the capacitor is transferred through the output terminals to the corresponding capacitor (71 or 72) of the summer circuit 70. Since the switched capacitor block circuits 61 and 66 are oppositely connected, the external capacitor of one is connected to its input terminals while the external capacitor of the other is connected to its output terminals. Thus, the sample-and-hold circuits 60 and 65 alternately sample the input signal and alternately transfer the sample to the summer circuit 70. This process continues in a "bucket brigade" fashion, until the voltage on the summer circuit capacitor is the same as the voltage on the capacitor of the switched capacitor block circuit, at which point the charge transfer ceases, and the voltage across the capacitor 72 is subtracted from the voltage across the capacitor 71.

The sample-and-hold circuits 60 and 65 are arranged so that the sample-and-hold circuit 60 samples the output of the gain stage 50 during a pulse from the modulated supply and regulator circuit 20, i.e., during an interval when the sensor 15 is energized, while the sample-and-hold circuit 65 samples the output of the gain stage 50 during the interval between pulses, when the sensor 15 is not energized. Accordingly, the sample obtained by the sample-and-hold circuit 60 includes a component from the sensor input signal and a component resulting from amplifier offset, while the sample obtained by the sample-and-hold circuit 65 includes only the offset component. When these signals are algebraically added in the summer circuit 70, there results a signal from which the offset has been cancelled, which signal is applied to the buffer stage 75.

More specifically, the buffer stage 75 includes a operational amplifier 76 having the inverting input terminal thereof connected through a resistor 77 to the output terminal 3 of the switched capacitor block circuit 66, and having the non-inverting input terminal thereof connected to the output terminal 2 of the switched capacitor block circuit 61. The output of the operational amplifier 76 is coupled to the inverting input terminal thereof through a feedback resistor 78.

The output of the buffer stage 75 is coupled through the low pass filter 80. More specifically, the low pass filter 80 includes a voltage divider comprising series connected resistors 81 and 82 connected between the output of the operational amplifier 76 and ground, and a capacitor 83 connected in parallel with the resistor 82, the output terminal being at the junction between the resistors 81 and 82.

The reference circuit 85 is a voltage divider comprising resistors 86 and 87 connected in series between a voltage reference source and ground. The reference voltage may be derived, as from a Zener diode, in the A/D converter (not shown) or other associated circuitry connected to the output of the processing circuit 10, this reference voltage preferably being approximately 1.2 VDC.

The rough offset correction circuit 90 includes an operational amplifier 91 having the non-inverting input terminal thereof connected to the junction between the resistors 86 and 87 of the reference circuit 85. The output to the operational amplifier 91 is connected through a resistor 92 to the inverting input terminal of an operational amplifier 93, the non-inverting input terminal of which is connected to ground through a resistor 94. The output of the operational amplifier 93 is connected to its inverting input through a feedback resistor 95. The output of the operational amplifier 93 is also coupled to the output of the operational amplifier 91 through a voltage divider 96 including a resistor 97, a potentiometer 98 and a resistor 99, connected in series, the output of the rough offset correction circuit 90 being taken at the wiper of the potentiometer 98.

The fine offset correction circuit 100 comprises a further voltage divider including a resistor 102, a potentiometer 103 and a resistor 104 connected in series across the voltage divider 96, the output of the fine offset correction circuit 100 being taken at the wiper of the potentiometer 103. The outputs of the rough and fine offset correction circuits 90 and 100 are added in a summer 105, which includes resistors 106 and 107. More specifically, the outputs of the rough and fine offset correction circuits 90 and 100 are connected, respectively, through the resistors 106 and 107 to the inverting input terminal of an operational amplifier 111 of the buffer stage 110. The non-inverting input terminal of the operational amplifier 111 is connected to ground through a resistor 112, and the output thereof is coupled to its inverting input terminal through a feedback resistor 113. The output of the buffer stage 110 is, in turn, coupled to the summer 70, where it is algebraically added to the other inputs thereto and coupled through the resistor 77 to the input of the buffer stage 75.

The adjustment provided by the potentiometer 98 in the rough offset correction circuit 90 is preferably designed to be adjusted at the factory, to provide an offset correction voltage sufficient to cancel offset errors in the sensor 15. A further adjustment of the potentiometer 103 in the fine offset correction circuit 100 can be made by the user to eliminate remaining offset errors introduced by the buffer stages 75 and 110 or by residual signals such as hysteresis, residual magnetism and the like which may occur in the sensor 15. In a constructional embodiment of the invention, the output of the operational amplifier 91 is at about −100 mv. and the output of the operational amplifier 93 is at about +100 mv.

From the foregoing, it can be seen that there has been provided an improved signal processing circuit for a sensor probe which is characterized by very low power consumption so as to be suitable for battery operation, and at the same time effectively provides cancellation of any offset errors occurring in the amplifier stages of the device, as well as offset errors in the sensor itself.

We claim:

1. Low power, error corrected signal apparatus for a sensor comprising: drive means adapted to be coupled to the sensor for intermittently energizing the sensor to enable it to produce a sensor signal in response to a stimulus, signal processing means having an input adapted to be coupled to the sensor for receiving the sensor signal and having an output, said signal processing means producing a processed signal including a processing offset error, storage means coupled to the output of said signal processing means for storing first and second samples of the processed signal taken respectively during an interval when the sensor is energized and during an interval when the sensor is not energized, and means coupled to said storage means for subtracting said second sample from said first sample to produce an output signal from which the processing offset error has been cancelled.

2. The apparatus of claim 1, wherein said drive means effects a periodic energization of the sensor such that the duty cycle of the period is very small.

3. The apparatus of claim 2, wherein said drive means includes a pulse generating means having a duty cycle less than 5%.

4. The apparatus of claim 1, wherein said signal processing means includes amplifier means.

5. The apparatus of claim 4, wherein said amplifier means includes gain adjustment means.

6. The apparatus of claim 1, wherein said storage means includes sample and hold circuitry.

7. Low power, error-corrected signal apparatus for a sensor comprising: drive means adapted to be coupled to the sensor for intermittently energizing the sensor to enable it to produce a sensor signal in response to a stimulus, amplifier means having an input adapted to be coupled to the sensor for receiving the sensor signal and having an output, said amplifier means producing an amplified signal including an amplifier offset error, first and second sample and hold circuit means for producing and storing first and second samples respectively of the amplified signal, means coupling said first and second sample-and-hold circuit means to said drive means for enabling said first sample-and-hold circuit means only during intervals when the sensor is energized and for enabling said second sample-and-hold circuit means only during intervals when the sensor is not energized, and summing means coupled to said first and second sample-and-hold circuit means for subtracting said second sample from said first sample to produce an output signal from which the amplifier offset error has been cancelled.

8. The apparatus of claim 7, wherein said drive means includes a pulse generating means for generating a periodic train of pulses with a very small duty cycle.

9. The apparatus of claim 7, wherein said signal amplifying means includes a differential instrumentation amplifier stage and a gain stage.

10. The apparatus of claim 9, wherein said gain stage includes gain adjustment means.

11. The apparatus of claim 7, and further comprising means for generating a sensor offset correction signal, an means coupling said sensor offset correction signal to said summing means for adding it to said output signal to eliminate sensor offset inaccuracies.

12. The apparatus of claim 11, wherein said means for generating said sensor offset correction signal includes adjustment means.

13. The apparatus of claim 7, and further comprising buffer amplifier means coupled to said summing means for amplifying said output signal, and means for generating a buffer offset correction signal, and means coupling said buffer offset correction signal to said summing means for adding it to said output signal to compensate for any offset inaccuracy introduced by said buffer amplifier means.

14. A low power method for producing a processed sensor signal and correcting offset error therein, said method comprising the steps of: intermittently energizing the sensor to enable it to produce a sensor signal in response to a stimulus, processing the intermittently produced sensor signal and thereby introducing a processing offset error, sampling the processed signal only during intervals when the sensor is energized to produce a first sample which includes a sensor signal component and an offset error component, sampling the processed signal only during intervals when the sensor is not energized to produce a second sample which includes only the offset error component, storing the first and second samples, and subtracting the second sample from the first sample to produce an output signal from which the offset error has been cancelled.

15. The method of claim 14, wherein the sensor is periodically energized with a very low duty cycle.

16. The method of claim 14, wherein the processing step includes amplifying the sensor signal.

17. The method of claim 14, and further comprising the steps of generating a sensor offset correction signal, and adding the sensor offset correction signal to the output signal for cancelling any sensor offset inaccuracies.

18. The method of claim 17, wherein the sensor offset correction signal is generated by providing a reference signal and adjusting the amplitude of the reference signal to a level sufficient to cancel sensor offset inaccuracies.

19. The method of claim 17, and further comprising the steps of buffer amplifying the output signal, and generating an auxiliary offset correction signal sufficient to cancel any offset inaccuracies introduced in the buffer amplifying step, and adding the auxiliary offset correction signal to the sensor offset correction signal before it is added to the output signal.

* * * * *